United States Patent [19]

Hooper

[11] 3,765,475

[45] Oct. 16, 1973

[54] APPARATUS FOR SOLDERING THICK FILM SUBSTRATES

[75] Inventor: Donald F. Hooper, Ben Lomond, Calif.

[73] Assignee: Iteck Corporation, Lexington, Mass.

[22] Filed: June 4, 1971

[21] Appl. No.: 149,962

[52] U.S. Cl. ........................ 165/12, 165/26, 165/64, 165/80, 219/347

[51] Int. Cl. ........................................... F21b 29/00

[58] Field of Search .................. 165/80, 64, 26, 12; 219/347, 85, 354

[56] References Cited

UNITED STATES PATENTS

| | | | |
|---|---|---|---|
| 2,209,099 | 7/1940 | Grueneklee | 165/64 |
| 3,562,481 | 2/1971 | West | 219/85 |

*Primary Examiner*—Charles Sukalo
*Attorney*—Homer O. Blair, Robert L. Nathans and Gerald H. Glanzman

[57] ABSTRACT

Heating apparatus for rapidly soldering thick film electrical substrates without overheating them and without subjecting them to damaging vibrations. The heating apparatus includes an enclosed housing having a support plate thereon upon which the substrate to be soldered is positioned. A source of radiant heat positioned within the housing is provided to heat the substrate to the desired soldering temperature. Also included in the apparatus is a fan assembly for blowing cooling air through the housing and a deflector assembly for controlling the direction of flow of said cooling air. The deflector assembly is designed to direct cooling air away from the hot plate during a heating interval of the system and to direct the cooling air directly at the hot plate during a cooling interval of the system for rapidly reducing the temperature of the substrate below soldering temperature after soldering has been effected.

17 Claims, 4 Drawing Figures

DONALD F. HOOPER
INVENTOR.
BY Gerald H. Glanzman
ATTORNEY.

APPARATUS FOR SOLDERING THICK FILM SUBSTRATES

BACKGROUND OF THE INVENTION

1. Field of the Invention

The present invention relates generally to heating apparatus. More specifically, the invention relates to a controllable heating apparatus designed for use in soldering small electrical components.

2. Description of the Prior Art

With the increasing popularity of miniaturization in electrical and electronic packaging, the problems associated with adequately connecting electrical components into a circuit have increased significantly. In such circuit packages, it is often necessary to attach a large number of electronic or electrical compoennts to a single, very small, base or substrate. For example, in a typical thick film circuit, it may be necessary to solder 20 or more components such as capacitors, transistors and the like to a single substrate having a surface area of less than one square inch. Obviously to effectively solder these small, sensitive components to the substrate without damaging or displacing them is a difficult problem.

Initially, electrical connection was accomplished by individually soldering each contact using a soldering iron or a solder gun. Obviously this is not a satisfactory procedure. Besides being costly and time consuming, it does not at all lend itself to modern mass production requirements and necessitates the employment of relatively skilled personnel.

The use of a conventional stove to supply the necessary soldering heat is another known approach. This technique has the advantage of being able to heat up an entire substrate at once thus enabling the simultaneous soldering of several components, however, it also suffers from serious disadvantages. Primarily, such stoves have a very high heat inertia, i.e. a long time is required to heat the stove up to the proper temperature and to cool it back down below soldering temperature. Besides the loss in time that results, this also reduces the ability to maintain the substrate temperature within acceptable limits which can result in many damaging effects to the highly sensitive circuit components.

A more satisfactory approach in the prior art is to employ radiant heat to effect the soldering. Basically, this technique enables a large number of joints to be soldered simultaneously and is faster than the above-mentioned methods. However, this technique is still inadequate in that it does not ensure uniform heating of the soldered joints such that each of the plurality of connections will be properly soldered. In addition, these systems often have the problem that when the source of radiant energy is withdrawn or turned off, the substrate will continue to heat up for a short period of time thereafter. This is detrimental because the electrical components are often constructed of plastic having a softening temperature only slightly above the soldering temperature and even a slight amount of additional heat can raise the temperature of the substrate sufficiently to ruin them. Finally, such heaters suffer from the problem that the heating apparatus is subject to a gradual heat buildup from the radiant heat which heat buildup can reduce the operating life of the apparatus.

In view of the above problems, it is desirable to provide an improved heating apparatus having particular applicability in the soldering of thick film electrical substrates. More specifically, it is desirable to provide an apparatus that can rapidly heat the substrate to the desired soldering temperature and then rapidly cool it down once the soldering is accomplished and before any damage can result to the circuit. It is further desirable to provide an apparatus wherein an entire substrate may be uniformly heated to permit the simultaneous soldering of a large number of electrical components positioned on the substrate. It is still further desirable to provide a heating apparatus that is substantially free from vibration such that the delicate circuit elements can be maintained properly positioned and free from damage. In general, it is desirable to provide a versatile, compact and inexpensive apparatus that is highly reliable, that has a long operating life and that can be used with a minimum of external control or adjustment.

SUMMARY OF THE PREFERRED EMBODIMENT OF THE INVENTION

In accordance with a preferred embodiment of this invention, the above and other desired goals are achieved by providing novel heating apparatus consisting of a housing having a highly heat conductive support plate or similar element mounted within an opening in its upper surface. Mounted within the housing and directly below the support plate is a source of radiant energy such as a conventional Quartz lamp. Radiation emitted by this lamp is used to heat the support plate by radiation, and, due to its construction, the plate will heat up rapidly. The substrate to be soldered is positioned on the plate and will also heat up rapidly and uniformly by conduction of heat through the plate to permit the simultaneous soldering of a plurality of circuit elements positioned on the substrate. Appropriate controls are provided within the housing to illuminate the lamp for a predetermined period of time to allow the substrate to reach the desired soldering temperature and then to shut the lamp off.

In order to insure, however, that the sensitive circuit components will not be damaged by overheating, an additional control in the form of forced cooling air is also provided. This control takes the form of a fan mounted adjacent one end of the housing and an associated deflector assembly. This deflector assembly comprises a motor driven, pivotally mounted vane or flap positioned within the housing and controlled such that during the heating interval of the system i.e. when the substrate is being heated up to effect soldering, the cooling air is directed away from the support plate, and during the cooling interval following the heating interval, the cooling air is caused to impinge directly upon the support plate to rapidly cool it and the substrate down below soldering temperature. In accordance with one aspect of the invention, the deflector assembly and the light source are controlled such that when the desired soldering temperature is reached, the lamp will be turned off and the deflector assembly will simultaneously redirect the cooling air toward the support plate.

In accordance with a further aspect of the invention, the apparatus is also provided with an idle heat setting or condition during which period the lamp is turned on at a controllable low power to maintain the substrate below the soldering temperature. The system is maintained in this condition during periods when the soldered substrate is being removed and a new substrate to be soldered is being positioned and also when certain repair work is required. This idle setting acts to prevent lamp deterioration that would result if the lamp is immediately turned on to full power and also increases the speed at which repairs can be effected. In accordance with an additional aspect of the invention, the fan is kept running continuously, and during both the idle period and the heating interval, the cooling air is directed through the housing and lamp assembly to prevent the apparatus from gradually rising to higher temperature levels during use. This also acts to extend the lamp life and make temperature control of the substrate more accurate.

Several basic advantages accrue from use of the system described above. Initially, accurate control over the amount of heat applied to the substrate is made possible by proper control of the deflector assembly and the lamp source. The support plate and the electrical substrate may be rapidly heated up to the desired temperature and then rapidly cooled down again greatly reducing the possibility of damaging the circuit elements as well as reducing operating time. In addition, the deflector assembly is designed to move in a relatively smooth, even motion thus preventing any vibrations from being transmitted through the system which vibrations could act to displace and damage the sensitive substrate components.

In general, the present invention provides a highly effective, safe to use and inexpensive apparatus that can rapidly and with a minimum of inconvenience be used for soldering thick film electrical substrates or for generally heating similar highly sensitive devices.

DESCRIPTION OF THE PREFERRED EMBODIMENT

Figure 1:
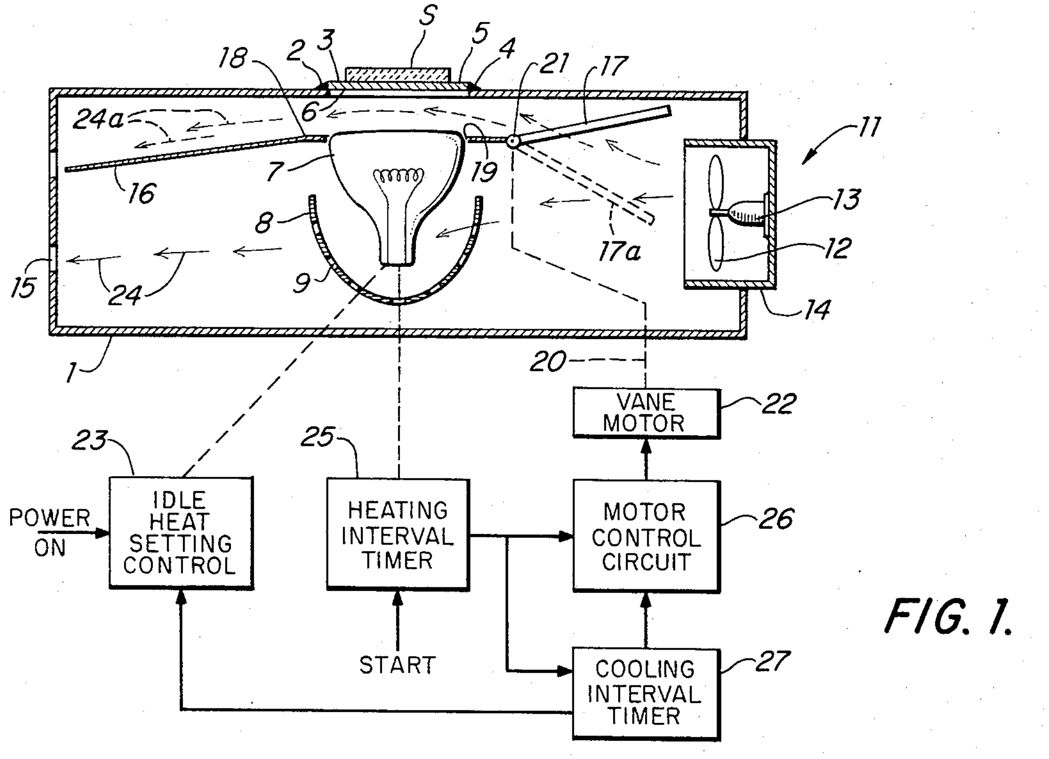
FIG. 1 illustrates, in somewhat diagramatic form, a cross-sectional view of the heating apparatus according to the present invention.
Figure 2:
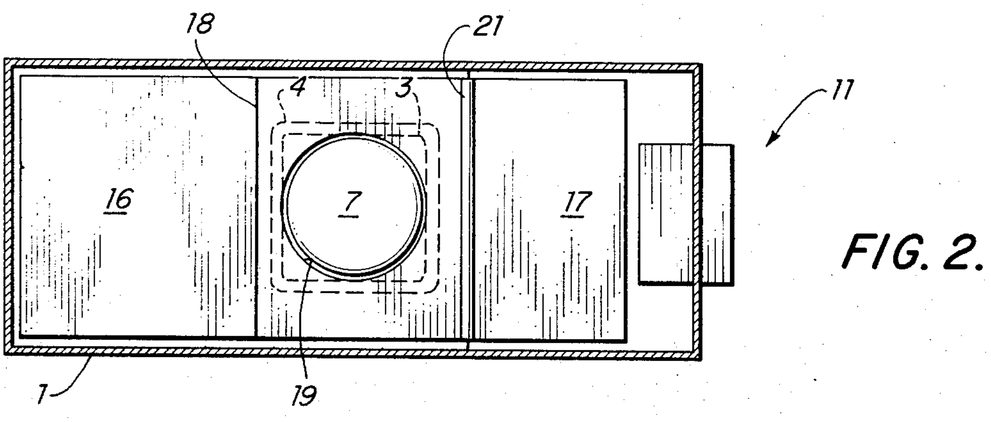
FIG. 2 illustrates a top view of the heating apparatus of FIG. 1 with the top wall of the housing removed for increased clarity.

FIGS. 1 and 2 illustrate, in somewhat diagramatic form, the heating apparatus according to a presently preferred embodiment of the invention. Reference numeral 1 represents the apparatus housing which may conveniently be constructed of aluminum. It should be understood that the entire apparatus will be enclosed within this housing and controlled by a suitable control panel mounted on one wall of the housing although, for purposes of illustration, the control circuitry is shown as being external thereto in FIG. 1. Located approximately in the center of the upper surface of the housing 1 is a substantially square shaped opening 2 within which is mounted a thin support plate 3. Various means 4 may be used to mount the plate within the opening. A preferred structure is to fasten a machined piece of fiberglass around the opening and then attach the plate to the fiberglass by a suitable low heat conductive cement. Obviously other techniques could also be used, the main criteria being that a low heat conductive medium be used to reduce the transfer of heat from the plate to the housing by conduction. The support plate 3, which need not necessarily be flat as shown, but which could be cup-shaped or of some other configuration, is preferably constructed of stainless steel although other materials may also be used. In this embodiment, the plate is approximately two and one-half inches square and has a thickness of about 40/1000 inches. Due to the extreme thinness of the plate and the high heat conduction of the material, this plate has a very low thermal inertia such that it will rapidly heat up upon the application of heat thereto, and rapidly cool down when the application of heat is terminated. The upper support surface 5 of the plate is polished while its lower surface 6 is provided with a coating of black paint to increase its heat absorption ability. It is upon this support plate that the substrates S to be soldered are placed. In thick film circuitry, this substrate will generally consist of a ceramic base or chip upon which conductors and passive components have already been attached and to which a plurality of electrical or electronic components such as capacitors, transistors, diodes, etc. must be soldered.

Mounted within the housing and directly below the support plate by suitable means not shown is a heating lamp 7 which may conveniently comprise a standard 300 watt Quartz-type sunlamp. A reflector 8 is positioned around the lamp to assist in directing radiant energy to th plate 3. This reflector is perforated as indicated at 9 for a reason to be described hereinafter.

Mounted within an opening in a side wall of the housing is a fan assembly 11. This assembly includes blades 12, motor 13 and protective casing 14 and is designed to run continuously during operation of the system, and blow cooling air through the housing. On the opposite wall of the housing from the fan assembly, are provided suitable vent openings 15 to permit the air to exhaust from the housing.

Also mounted within the housing is an air deflection assembly to control the flow of air through the housing. This assembly includes a stationary deflector 16 and a movable deflector or vane 17. The stationary deflector is bent as shown at 18 and has an apppropriate opening 19 for receipt of the lamp 7. The movable deflector or vane 17 is pivotally attached to the end of stationary deflector 16 by means of a pivot rod 21 or other suitable mechanism for rotation thereabout. the vane is rotatable about pivot rod 21 between the position 17 shown in solid lines and the position 17*a* shown in dotted lines by suitable motor 22. For increased portability, the entire deflector assembly may also be constructed of aluminum.

A clearer understanding of the invention as well as the relationship among the disclosed control circuitry can be better understood by following through, in sequence, a typical operation of the system. Let it first be assumed that the entire system is shut down. Initially the fan 11 is turned on by an appropriate switch, not shown. The fan will run continuously thereafter. In its initial position the vane 17 is in the up position shown in solid line and lamp 7 is off.

As the initial step in the operation, the power to the system is turned on. This causes the lamp to be turned on at a low intensity as set on an Idle Heat Setting Control 23. It is during this idle condition that the substrate S to be soldered is placed on the support plate, the elecrical or electronic components to be soldered properly positioned, and the solder or solder creme applied.

Also in this condition any necessary repair work such as hand soldering may be carried out. Several advantages are obtained by providing this idle condition. Initially, the time required for the support plate and hence the substrate to reach soldering temperature is reduced. This increases the speed of operation. Also, the operating life of the lamp is extended beyond that which it would have if it were turned on from zero to full intensity in one step.

Figure 3:
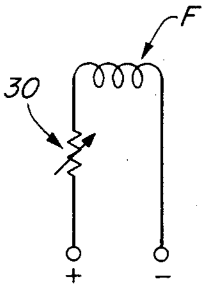
FIG. 3 illustrates a preferred manner in which the intensity of the radiant energy source may be controlled.

To control the idle heat temperature, the filament F of the lamp may be designed as shown in FIG. 3. The potentiometer 30 will enable control of current flow and hence of lamp intensity. Obviously, if desired, separate filaments may be provided, for idle heat control and for maximum heating intensity. By being able to control the idle heat setting great versatility is provided. For example, for certain repair work it may be desired to set the idle heat to maintain the temperature of the substrate just below the soldering temperature such that it can rapidly be raised to the soldering temperature. Similarly, for positioning new substrates to be soldered, the temperature may be kept much lower to preheat the lamp and to reduce operating time. It should also be pointed out that in this idle condition, the deflector vane 17 is in the up position and is directing cooling air through the perforations 9 provided in the reflector 8 (as indicated by solid arrows 24) to prevent overheating of the lamp and the housing. This also helps to extend the operating life of the lamp.

When the substrate is ready to be soldered, an appropriate start button is pressed which acts to turn the lamp on to full intensity. The lamp will remain in this condition for the period set on the Heating Interval Timer 25. During this period, the plate 3 will heat up rapidly due to its very low thermal inertia and conduct the heat up to the ceramic chip S in order to heat it up to the temperature necessary to melt the solder. The bottom 6 of the plate is painted black to further increase the heat absorption ability of the plate. During this period the deflector vane will continue to remain in the up position and the air from the fan will still be deflected away from the plate.

Figure 4:
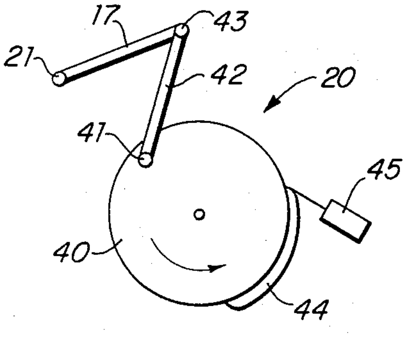
FIG. 4 illustrates a preferred structure for controlling movement of the deflector vane.

At the end of the time set on the Heating Interval Timer, the lamp will shut off and simultaneously the Motor Control Circuit 26 will be actuated to start the vane 17 moving downward. The actual structure employed to control the movement of the vane could comprise any of several well known devices. A preferred structure is shown in FIG. 4. As shown in that figure, the mechanical connection 20 (FIG. 1) comprises a disc-shaped element or crank 40 which is slowly rotated around its axis by means of vane motor 22. Pivotally coupled to the crank at 41 is a follower rod or crankshaft 42 which is also pivotally connected to the free end of deflector vane 17 as shown at 43. As can be seen in FIG. 4, rotation of the disc in a counterclockwise direction will cause the shaft 42 to move downward and bring the deflector vane down with it.

Included on the disc 40 is a cam surface 44 which cooperates with a switch 45. This cam surface is designed such that when the vane 17 reaches its down position (position 17a in FIG. 1), it will release the switch 45 which shuts off vane motor 22 which in turn will stop the vane 17 in its down or cooling interval position. The vane will remain in this position for the time set on Cooling Interval Timer 27 (FIG. 1) at which time Motor Control Circuit 26 will actuate vane motor 22 to initiate further counterclockwise rotation of disc 40 to return flap 17 to its up position as shown in FIG. 4. At that point, the Motor Control Circuit will again shut off, stop motor 22, and terminate movement of the flap until the next cycle is initiated by pressing the start button.

This above-described vane control system is particularly advantageous in that the vane will move very smoothly imparting a minimum amount of damaging vibrations to the housing and substrate which could damage the sensitive components.

When the vane starts to move down, it can be seen that the air from the fan will then be deflected directly against the support plate as shown by the dashed arrows 24*a* in FIG. 1. This cooling air, in conjunction with the lamp being turned off, acts to rapidly cool the plate and the substrate down below the soldering temperature. This rapid cooling greatly reduces the possibility of the delicate circuit being damaged by overheating which could result if cooling air were not provided. Merely shutting off the lamp is not sufficient. As mentioned previously, after the lamp is shut off, the top surface of the plate would normally continue to heat up for a short period of time which could be enough to ruin the components.

At the end of the time set on the Cooling Interval Timer, the Motor Control Circuit will initiate upward movement of the vane as described above. At this time the lamp will also be returned to its Idle Heat Setting condition, the flap will stop in its up position and the system is ready for the now soldered substrate to be removed and replaced with a new one.

The time cycle for the above-described sequence of operations will depend on various factors such as the type of solder being used, the type of components being soldered, the temperature required, and the lamp being used. For example, old solder will melt at a different temperature than new solder. Typical periods, however, would be about 15 seconds for the heating interval in order to heat the solder to the melting temperature which may be in the neighborhood of 350°F or more and about 19 seconds for the cooling interval.

It should be understood that the above-described embodiment is meant to be a preferred embodiment only and that many other modifications and alterations would readily present themselves to those skilled in the art. For example, in some applications it might not be necessary to shut the lamp off at the end of the heating interval. Even with the lamp on, the cooling air might be enough to sufficiently lower the temperature of the object being treated. In other situations it may be desirable to have the fan shut off at the end of the cooling cycle or to use an entirely different cooling agent. Also, other mechanisms may be used to control the deflector vane than the assembly described. Finally, it should be understood that this invention is not limited to the soldering of electrical circuits but could be used in any system wherein accurate temperature control is required to heat and cool objects.

While there has been described and illustrated a preferred embodiment of the present invention, it is apparent that numerous alterations, omissions, and additions may be made without departing from the spirit thereof. Accordingly, the invention should be limited only as required by the scope of the following claims.

I claim:

1. Heating apparatus comprising:

a. a support frame;
b. support means positioned on said support frame for receiving an object to be heated, said support means having a low thermal inertia such that it will rapidly heat up upon the application of heat thereto and rapidly cool down upon termination of the application of heat;
c. heating means for applying heat to said support means during a first heating interval for heating said object supported thereon;
d. means for directing a cooling agent through said support frame;
e. deflector means having a first heating position for directing said cooling agent away from said support means during said first heating interval and a second cooling position for directing said cooling agent toward said support means during a second cooling interval following said heating interval;
f. drive means for driving said deflector means between said first and second positions; and
g. control means coupled to said drive means for controlling the time during which said deflector means remains in said first and second positions for controlling said heating and cooling intervals.

2. Apparatus as recited in claim 1 wherein said cooling agent directing means includes fan means for blowing cooling air through said apparatus.

3. Apparatus as recited in claim 2 wherein said deflector means includes: a deflector vane pivoted at one end thereof and having a first heating interval position and a second cooling interval position; and wherein said drive means is coupled to said deflector vane and to said control means for driving said vane from said first position to said second position for controlling the direction of flow of said cooling air during said heating and cooling intervals.

4. Apparatus as recited in claim 3 wherein said control means includes timer means for controlling the length of time that said vane remains in said first and second positions for controlling the time of said heating and cooling intervals.

5. Apparatus as recited in claim 1 wherein said heating means further includes means for maintaining said support means at an elevated idle temperature which is less than the temperature of said support means during said heating interval.

6. Apparatus as recited in claim 5 and including means for maintaining said support means at said idle temperature prior to initiation of said heating interval and for returning said support means to said idle temperature at the termination of said cooling interval.

7. Apparatus as recited in claim 1 wherein said deflector means comprises a deflector vane pivoted at one end thereof for rotation between said first and second positions and wherein said drive means comprises:
a. rotatable crank means;
b. a rod pivotally coupled to said crank means and to said deflector vane; and
c. motor means for rotating said crank means to impart translational movement to said rod for moving said vane from said first to said second position in a smooth substantially vibration free manner at the end of said heating interval.

8. Apparatus as recited in claim 7 wherein said crank means has a cam surface thereon and wherein said control means includes switch means cooperable with said cam surface for stopping said motor means when said vane is moved to said second position.

9. Apparatus as recited in claim 8 wherein said control means further includes timer means for maintaining said vane in said second position for a predetermined period of time constituting said cooling interval; and means for actuating said motor means at the end of said predetermined period of time to return said vane to said first position.

10. Apparatus for soldering electrical substrates comprising:
a. support means for receiving a substrate to be soldered;
b. heating means for applying heat to said support means during a first heating interval;
c. means for applying a cooling agent to said support means during a second cooling interval following said first heating interval, said cooling agent applying means comprising a fan for blowing cooling air, a deflector vane pivoted at one end thereof and having a first heating interval position and a second cooling interval position, and drive means coupled to said deflector vane for driving said vane from said first position to said second position for controlling the direction of flow of said cooling air during said heating and cooling intervals; and
d. control means coupled to said drive means for controlling the time of said heating and cooling intervals by controlling the period of time during which said cooling air is applied to said support means.

11. Apparatus as recited in claim 10 wherein said control means includes timer means for controlling the length of time that said vane remains in said first and second positions for controlling the time of said heating and cooling intervals.

12. Apparatus for soldering electrical substrates comprising:
a. support means for receiving said substrate to be soldered;
b. heating means for applying heat to said support means during a first heating interval, said heating means further including idle heating means for maintaining said support means at an elevated idle temperature prior to said heating interval which is less than the temperature of said support means during said heating interval;
c. means for applying a cooling agent to said support mans during a second cooling interval following said first heating interval;
d. control means for controlling the time of said heating and cooling intervals; and
e. means coupled to said idle heating means for controlling said elevated idle temperature.

13. Apparatus as set forth in claim 12 including means for returning said support means to said idle temperature at the termination of said cooling interval.

14. Apparatus as recited in claim 1 and further including means for coupling said control means to said heating means for terminating the application of heat to said support means at the end of said heating interval.

15. Apparatus as recited in claim 1 wherein said support means has first and second opposed surfaces and wherein said heating means comprises radiant energy means spaced from said first surface for applying heating radiation to said first surface for heating an object positioned on said second surface by conduction of heat through said support means.

16. Apparatus as recited in claim 15 wherein said deflector means comprises means for directing said cooling agent toward said radiant energy means during said heating interval for maintaining said radiant energy means relatively cool.

17. Apparatus as recited in claim 16 wherein said radiant energy means includes a lamp having a perforated reflector positioned thereabout for directing radiant energy toward said first surface of said support means, said cooling agent directing means including means for directing said cooling agent through said perforated reflector and into contact with said lamp during said heating interval for maintaining said lamp relatively cool.

* * * * *